United States Patent
Chang et al.

(10) Patent No.: US 9,875,328 B2
(45) Date of Patent: Jan. 23, 2018

(54) HIGH-SPEED LATCH CIRCUITS BY SELECTIVE USE OF LARGE GATE PITCH

(71) Applicant: International Business Machines Corporation, Armonk, NY (US)

(72) Inventors: Leland Chang, New York, NY (US); Robert K. Montoye, New York, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/235,134

(22) Filed: Aug. 12, 2016

(65) Prior Publication Data

US 2016/0350451 A1 Dec. 1, 2016

Related U.S. Application Data

(63) Continuation of application No. 14/642,838, filed on Mar. 10, 2015, now Pat. No. 9,496,854.

(51) Int. Cl.
  *G06F 17/50* (2006.01)
  *H03K 3/356* (2006.01)
  *H03K 3/037* (2006.01)

(52) U.S. Cl.
  CPC ........ *G06F 17/505* (2013.01); *G06F 17/5068* (2013.01); *H03K 3/037* (2013.01); *H03K 3/356104* (2013.01)

(58) Field of Classification Search
  CPC .............. G06F 17/5068; H03K 3/356104
  USPC ........................................... 716/102
  See application file for complete search history.

(56) References Cited

U.S. PATENT DOCUMENTS

| 5,038,192 A | 8/1991 | Bonneau et al. |
| 5,673,230 A | 9/1997 | Kuriyama |
| 5,831,462 A * | 11/1998 | Witt ............... G06F 9/3869 327/199 |
| 5,964,884 A | 10/1999 | Partovi et al. |

(Continued)

OTHER PUBLICATIONS

Alam et al.,"Gate-Pitch Optimization dor Circuit Design Using Strain-Engineered Multifinger Gate Structures", Nov. 2012, IEEE Transactions on Electron Devices, vol. 59, Iss. 11, pp. 3120-3123.*

(Continued)

*Primary Examiner* — Sun Lin
(74) *Attorney, Agent, or Firm* — Gilbert Harmon, Jr.

(57) ABSTRACT

An apparatus for storing data includes a latch circuit comprising a first set of transistors that propagate an input signal to an output signal and a second set of transistors that do not propagate the input signal of the latch circuit to the output signal wherein a gate pitch for the first set of transistors is substantially greater than a gate pitch for the second set of transistors. Also disclosed herein, a method for improving circuit performance includes receiving an electronic representation of a plurality of latching circuits associated with a design file and increasing transistor gate pitch for selected transistors of the plurality of latching circuits, wherein the selected transistors comprise transistors that propagate an input signal to an output signal. The method may also include fabricating a chip comprising the plurality of latching circuits. A computer program product corresponding to the method is also disclosed within.

16 Claims, 4 Drawing Sheets

(56) References Cited

U.S. PATENT DOCUMENTS

| | | | |
|---|---|---|---|
| 6,243,284 B1* | 6/2001 | Kumagai | G11C 11/5692 365/104 |
| 6,359,804 B2 | 3/2002 | Kuriyama et al. | |
| 6,703,868 B2 | 3/2004 | Savaria et al. | |
| 7,098,438 B1* | 8/2006 | Frazier | H03K 3/315 250/214 LS |
| 7,173,449 B2* | 2/2007 | Otsuka | H04L 25/0272 326/30 |
| 7,697,320 B2 | 4/2010 | Masuo et al. | |
| 8,174,868 B2* | 5/2012 | Liaw | G11C 8/16 365/154 |
| 8,274,319 B2* | 9/2012 | Maeno | H03K 3/356156 327/203 |
| 8,497,723 B2* | 7/2013 | Zhuang | H03K 3/356139 327/212 |
| 8,570,076 B2* | 10/2013 | Brown | H03L 7/00 327/117 |
| 9,081,049 B2* | 7/2015 | Ainspan | H03K 19/094 |
| 9,257,439 B2* | 2/2016 | Liaw | H01L 27/1104 |
| 9,496,854 B2* | 11/2016 | Chang et al. | H03K 3/356104 |

OTHER PUBLICATIONS

Chang et al., "High-Speed Latch Circuits by Selective Use of Large Gate Pitch", U.S. Appl. No. 14/642,838, filed Mar. 10, 2015, 26 pages.

IBM Appendix P, list of patents and patent applications treated as related, Aug. 11, 2016, 2 pages.

* cited by examiner

HIGH-SPEED LATCH CIRCUITS BY SELECTIVE USE OF LARGE GATE PITCH

BACKGROUND OF THE INVENTION

The present invention relates generally to the field of integrated circuit design, and more particularly to improving the performance of integrated circuits.

Latch circuits are a type of circuit with two stable states, which can be used to store state information. For this reason, latch circuits are used as signal capture elements in electronic circuits. Improving the performance of latch circuits would lead to improved integrated circuit performance.

SUMMARY

As disclosed herein, an apparatus for storing data includes a latch circuit comprising a first set of transistors that propagate an input signal to an output signal within the latch circuit and a second set of transistors that do not propagate the input signal of the latch circuit to the output signal of the latch circuit. The gate pitch for the first set of transistors is substantially greater than a gate pitch for the second set of transistors. For example, the gate pitch for the first set of transistors may be at least double the gate pitch for the second set of transistors.

Also disclosed herein, a method, executed by a computer, for improving circuit performance includes receiving an electronic representation of a plurality of latching circuits associated with a design file and increasing a transistor gate pitch for selected transistors of the plurality of latching circuits within the electronic representation, wherein the selected transistors comprise transistors that propagate an input signal of a latch to an output signal of the latch. The method may include updating the electronic representation of the plurality of latching circuits. The method may also include fabricating a chip comprising the plurality of latching circuits.

DETAILED DESCRIPTION

Currently available circuit optimization techniques are effective as long as there is considerable surplus area to be filled by increasing the size of all of the transistors. However, currently available techniques do not respond well to having space constraints to work around. For example, some manufacturers may produce products with the goal of keeping the integrated circuit footprint small in order to improve yields while still optimizing circuit performance. As a result, the cumulative area penalty resulting from increasing the size of each of the transistors may simply not be feasible. The embodiments disclosed herein improve the speed of integrated circuits with less area penalty.

In advanced CMOS technologies, particularly those that incorporate strained silicon for performance enhancement, gate pitch scaling presents a tradeoff between performance and density. Reduced gate pitch enables a reduction in transistor area but also a simultaneous degradation in both stress transfer and parasitic contact resistance and capacitance. Judicious use of varied gate pitch in key standard cell library elements such as latches can thus optimize both performance and density.

Figure 1:
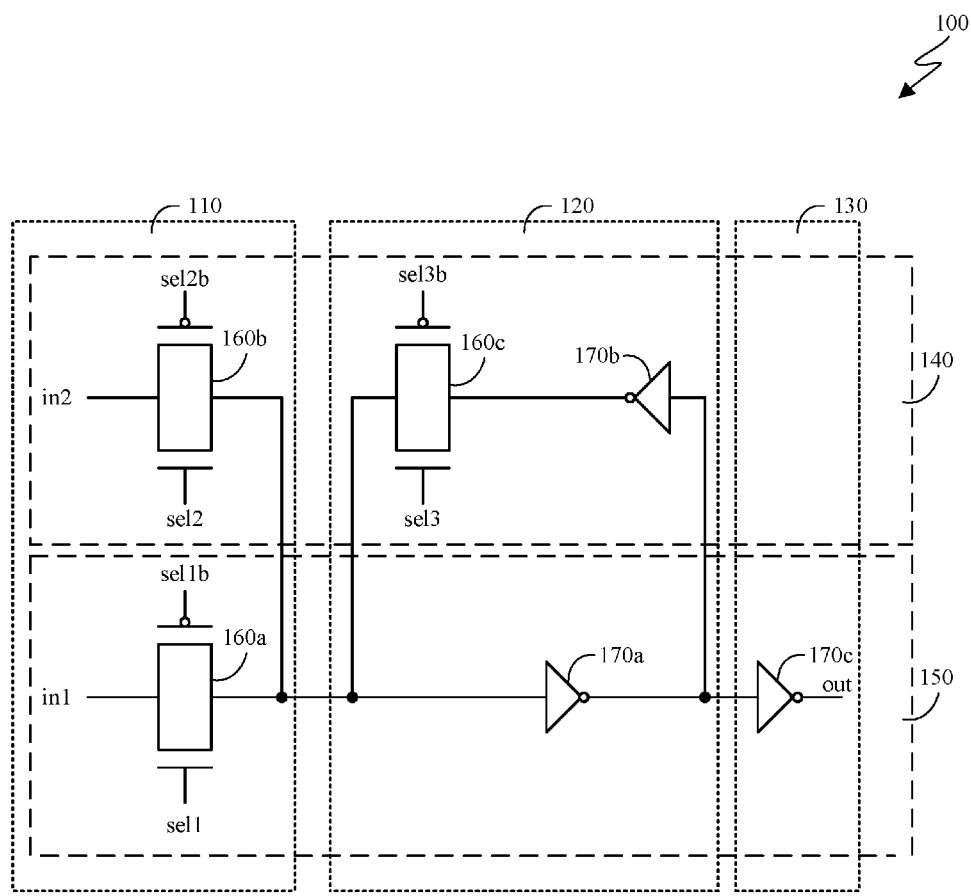
FIG. 1 is a schematic diagram of one embodiment of a latch circuit in accordance with the present invention.

FIG. 1 is a schematic diagram of one embodiment of a latch circuit 100 in accordance with the present invention. As depicted, the latch circuit 100 includes an input mux 110, a state retention circuit 120, and an output buffer 130 that are partitioned into non-critical elements 140 and performance-critical elements 150. The latch circuit 100 corresponds to one embodiment of the data storage apparatus disclosed herein.

Input mux 110 (sometimes called a multiplexer or a data selector) selects one of several digital input signals and forwards the selected input into a single line. In the depicted embodiment, the input mux 110 includes two transmission gates 160a and 160b. Transmission gate 160a selectively blocks or passes the signal from input 1 (in1). Similarly, transmission gate 160b selectively blocks or passes the signal from input 2 (in2). Only one of these signals will be passed through to the state retention circuit 120. Input signals multiplexed into a latch circuit may include, but are not limited to, disparate circuit paths or external scan signals used only for test mode operation.

State retention circuit 120 may be the part of the latch circuit 100 responsible for maintaining the memory state within the cell. The depicted embodiment of the state retention circuit 120 includes inverter 170a, inverter 170b, and transmission gate 160c. State retention circuit 120 has two stable states: high-output and low-output. The depicted embodiment of the state retention circuit 120 is only one example of how a state retention circuit within a latch circuit may be configured.

Inverter 170a receives the signal propagated by the input mux 110. The output of inverter 170a is coupled to inverter 170b to provide a feedback path for the latch. The output of inverter 170b is coupled to transmission gate 160c, which will either block the signal from inverter 170b or pass it. If the transmission gate 160c allows the signal to pass, the signal returns to inverter 170a. The output from inverter 170a may also proceed to the output buffer 130. In this way, the two inverters 170a and 170b form a cross-coupled latch circuit to provide state retention while transmission gate 160c determines whether the latch is in state retention mode or is instead being written.

Output buffer 130 takes a "weak" signal source that isn't capable of sourcing or sinking much current and boosting the current capacity of the signal. In the depicted embodiment, the output buffer 130 comprises an inverter 170c. Inverter 170c receives the signal from the state retention circuit 120 and inverts it. The output of this inverter 170c corresponds to the output of the latch circuit 100.

Performance-critical elements 150 correspond to the elements which propagate one or more selected input signals of the latch circuit to an output signal of the latch circuit. The performance-critical elements 150 are the elements that contribute to delay within the latch circuit. Therefore, the transistors associated with the performance-critical elements 150 may be configured with substantially increased gate pitch, as is depicted in FIG. 2B. FIG. 1 shows that some transistors from the input mux 110, the state retention circuit 120, and the output buffer 130 may all be performance-critical elements 150. In the depicted embodiment, non-critical elements 140 are elements that do not propagate the selected input signal of the latch to the output signal of the latch, i.e. all the elements not included in the performance-critical elements 150.

Figure 2A:
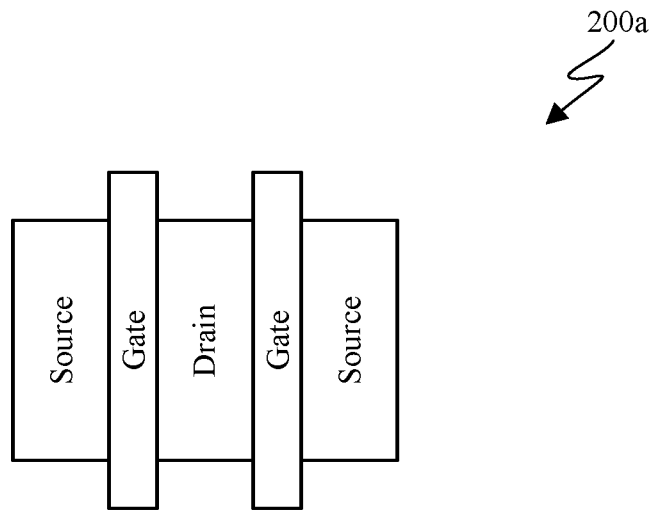
FIG. 2A is a layout diagram depicting one embodiment of a transistor configured with standard gate pitch in accordance with the present invention.
Figure 2B:
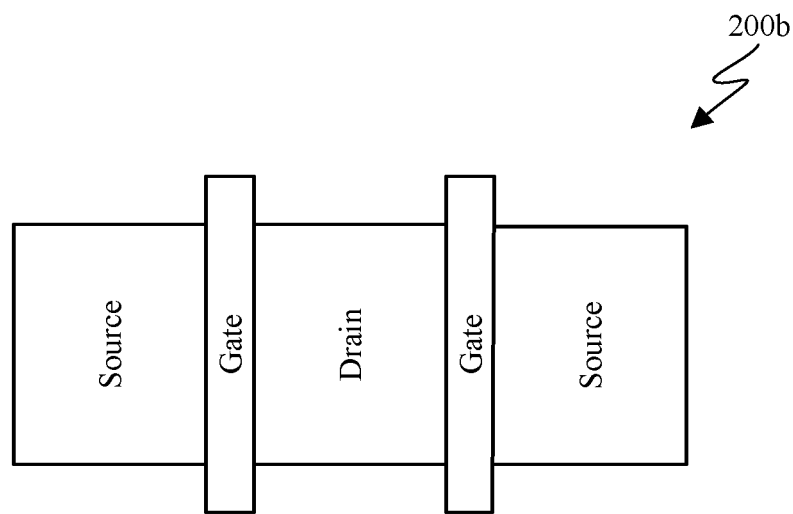
FIG. 2B is a layout diagram depicting one embodiment of a transistor configured with increased gate pitch in accordance with the present invention.

FIGS. 2A-2B are layout diagrams depicting one embodiment of transistors (200a and 200b) configured with standard gate pitch and one embodiment of transistors configured with increased gate pitch in accordance with the present invention. FIG. 2B depicts one embodiment of the configuration of the transistors from the first set of transistors (i.e. the performance-critical elements) in the latch circuit, while FIG. 2A depicts one embodiment of the configuration of the transistors from the second set of transistors in the latch circuit (i.e. the non-critical elements). Increased gate pitch in a transistor fabricated in advanced CMOS technologies, such as is depicted by FIG. 2B, enables higher performance than a transistor designed at standard gate pitch, such as is depicted by FIG. 2A. Such increased gate pitch allows for increased stress transfer from known strained silicon techniques including but not limited to overlayer stress films or embedded lattice mismatched materials (e.g. SiGe, Si:C) due to increased source/drain area. Such enhanced stress in the transistor channel can significantly enhance carrier mobility, which directly leads to higher transistor drive current and performance. In addition, increased gate pitch also allows for more and/or larger diameter source/drain contacts, which can reduce parasitic resistance, as well as larger contact-to-gate spacing, which can reduce parasitic capacitance—both of which further improve transistor performance.

Increased gate pitch to improve transistor performance comes at a cost of increasing transistor area. However, in practical latch circuit implementations, the performance-critical elements 150 generally comprise only a small fraction of the overall circuit area; increasing gate pitch in these devices can thus improve latch circuit delay significantly while incurring only a small area penalty.

Figure 3:
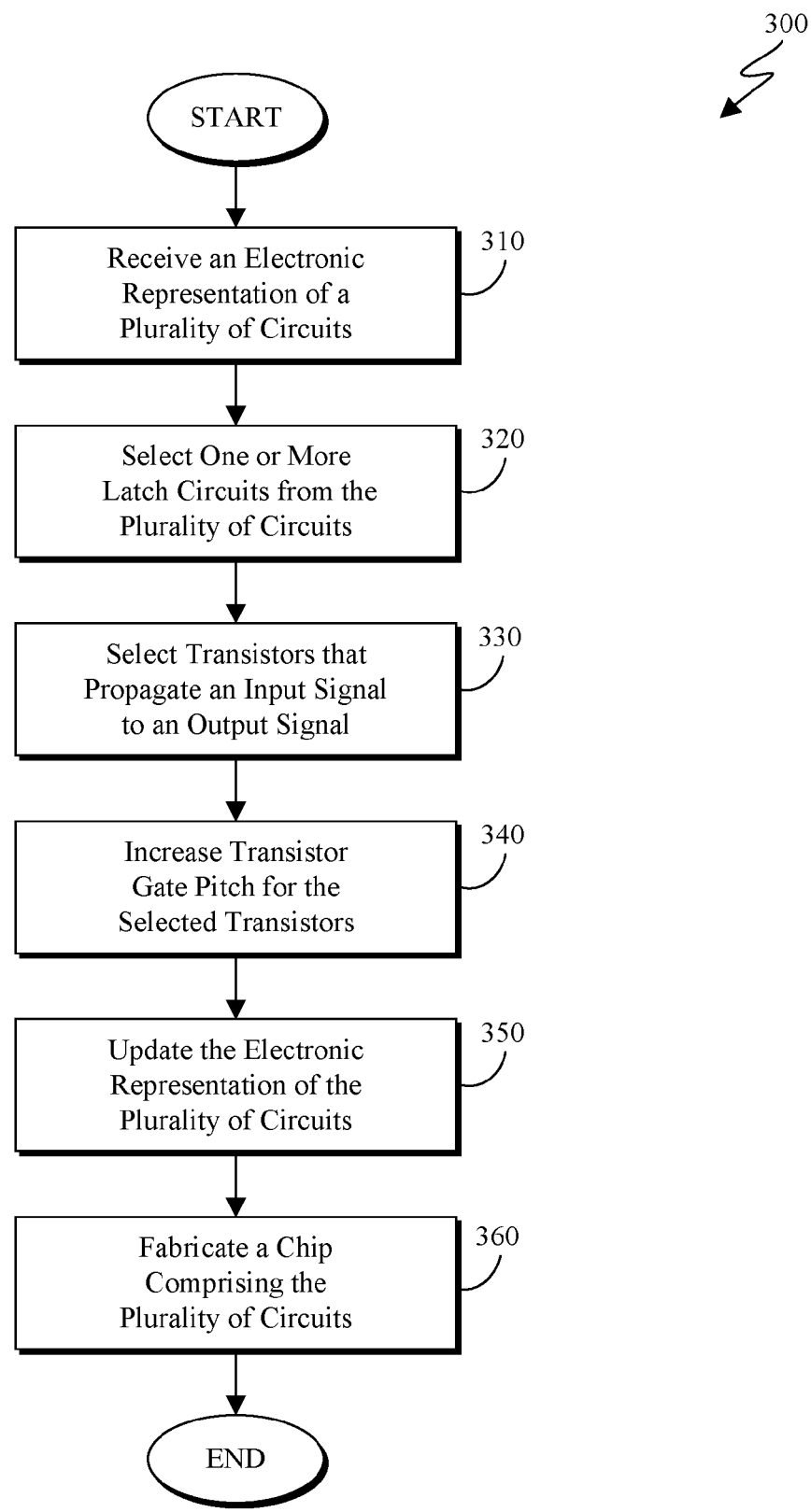
FIG. 3 is a flowchart depicting one embodiment of a circuit optimization method in accordance with the present invention.

FIG. 3 is a flowchart depicting one embodiment of a circuit optimization method in accordance with the present invention. As depicted, the circuit optimization method 300 includes receiving (310) an electronic representation of a plurality of circuits, selecting (320) one or more latch circuits from the plurality of circuits, selecting (330) transistors that propagate an input signal to an output signal, increasing (340) a transistor gate pitch for the selected transistors, updating (350) the electronic representation of the plurality of circuits, and fabricating (360) a chip comprising the plurality of circuits. The circuit optimization method 300 may be used to fabricate a chip that minimizes the delay exhibited by a latch circuit.

Receiving (310) an electronic representation of a plurality of circuits associated within a design file may include receiving representations of many kinds of circuits within an integrated circuit. The design file may correspond to a design library or a chip design.

Selecting (320) one or more latch circuits from the plurality of circuits may include identifying which circuits within the plurality of circuits are latch circuits. These circuits are selected to be altered by the circuit optimization method as disclosed herein. In some embodiments, each latch circuit is selected and altered one at a time. In other embodiments, multiple latch circuits are selected and altered simultaneously.

Selecting (330) transistors that propagate an input signal to an output signal may include locating the input and output signals within each latch circuit and identifying the transistors associated with the input and output signals. Within a latch circuit, a substantially instantaneous change in voltage at an input results in a delayed change in voltage at the output, which reflects the delay of the circuit. Therefore, identifying transistors that propagate an input signal to an output signal may be used to identify the transistors which contribute to latch delay. The selected transistors may include pass transistors, inverting transistors, and output buffers. In one embodiment, the selected transistors correspond to the performance-critical elements 150 depicted in FIG. 1.

Increasing (340) the transistor gate pitch for the selected transistors may include scaling the gate pitch in the selected transistors. Scaling the gate pitch increases the current flow of the transistor and decreases the delay of the latching circuits. Scaling the gate pitch enables more current to flow through the transistor at once, and therefore the propagation of an input signal to an output signal can occur more quickly within the latching circuits. In one embodiment, the increased gate pitch is an integer multiple of the original gate pitch. The unselected transistors may maintain the original gate pitch. Increasing transistor gate pitch for only the selected transistors increases circuit performance with only limited area penalty as compared to previous methods. In some embodiments, doubling the transistor gate pitch for the selected transistors results in an increase in footprint of approximately 30 percent for latch circuits and no penalty for other circuits.

Updating (350) the electronic representation of the plurality of circuits may include saving the representation to a design file. Updating the electronic representation may also include saving the altered representation (i.e. the representation which reflects the selectively increased transistor gate pitches) to a new design file. In another embodiment, updating the electronic representation includes updating the electronic representation within the existing design file to reflect the increased transistor gate pitches.

Fabricating (360) a chip comprising the plurality of circuits may include manufacturing a chip based on the electronic representation of the plurality of circuits. Fabricating (360) a chip comprising the plurality of circuits may also include constructing a chip with specifications matching those within the updated electronic representation that resulted from the circuit optimization process as disclosed herein. Fabricating (360) a chip comprising the plurality of circuits may also include using the updated electronic representation as a template for the production of a chip. The fabricated chip may correspond to the latch circuit 100 depicted in FIG. 1.

Figure 4:
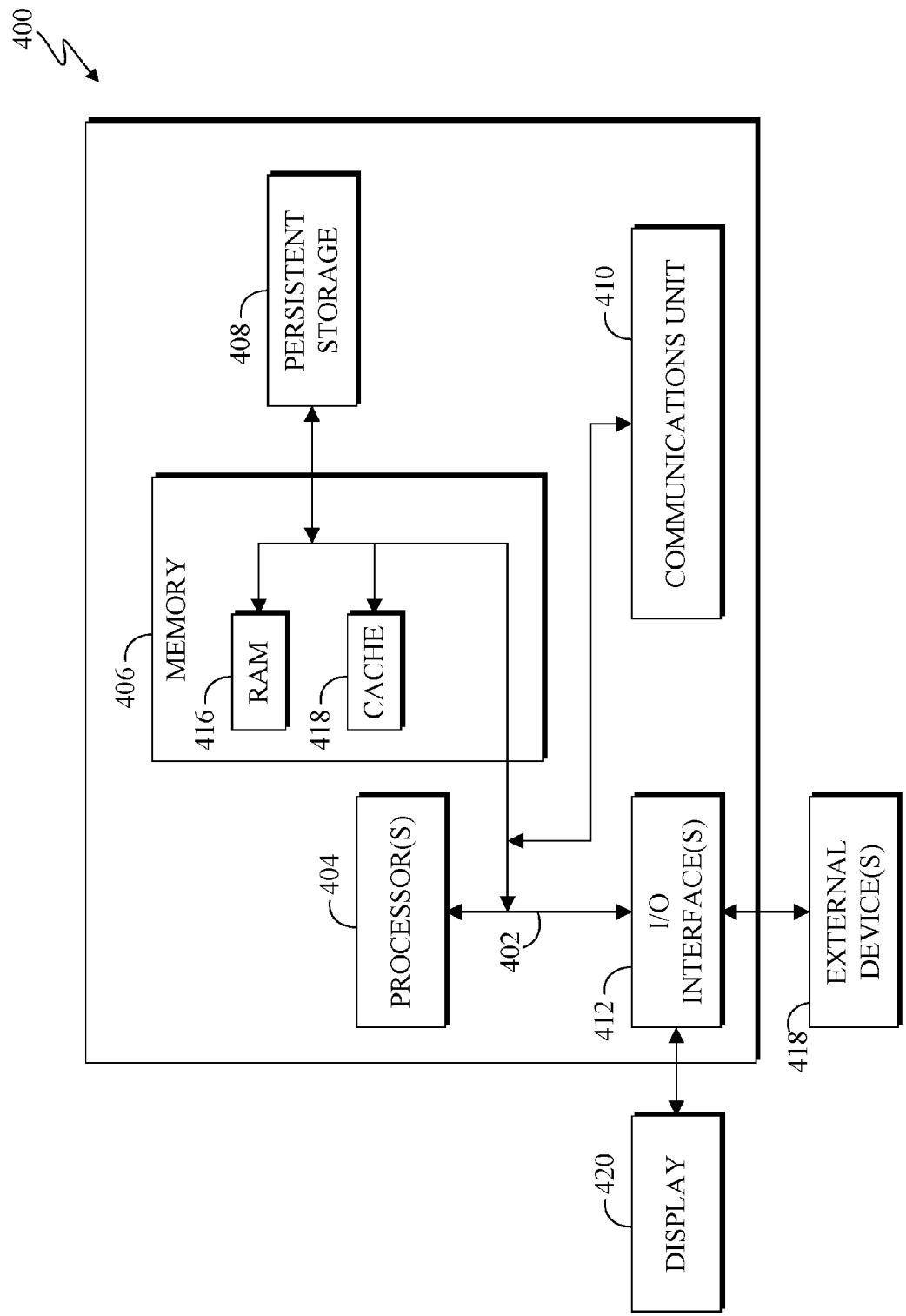
FIG. 4 is a block diagram depicting one example of a computing apparatus (i.e., computer) suitable for executing the methods disclosed herein.

FIG. 4 depicts a block diagram of components of a computer 400 in accordance with an illustrative embodiment of the present invention. It should be appreciated that FIG. 4 provides only an illustration of one implementation and does not imply any limitations with regard to the environments in which different embodiments may be implemented. Many modifications to the depicted environment may be made.

As depicted, the computer 400 includes communications fabric 402, which provides communications between computer processor(s) 404, memory 406, persistent storage 408, communications unit 410, and input/output (I/O) interface(s) 412. Communications fabric 402 can be implemented with any architecture designed for passing data and/or control information between processors (such as microprocessors, communications and network processors, etc.), system memory, peripheral devices, and any other hardware components within a system. For example, communications fabric 402 can be implemented with one or more buses.

Memory 406 and persistent storage 408 are computer-readable storage media. In this embodiment, memory 406 includes random access memory (RAM) 414 and cache memory 416. In general, memory 406 can include any suitable volatile or non-volatile computer-readable storage media.

One or more programs may be stored in persistent storage 408 for access and/or execution by one or more of the respective computer processors 404 via one or more memories of memory 406. In this embodiment, persistent storage 408 includes a magnetic hard disk drive. Alternatively, or in addition to a magnetic hard disk drive, persistent storage 408 can include a solid state hard drive, a semiconductor storage device, read-only memory (ROM), erasable programmable read-only memory (EPROM), flash memory, or any other computer-readable storage media that is capable of storing program instructions or digital information.

The media used by persistent storage 408 may also be removable. For example, a removable hard drive may be used for persistent storage 408. Other examples include optical and magnetic disks, thumb drives, and smart cards that are inserted into a drive for transfer onto another computer-readable storage medium that is also part of persistent storage 408.

Communications unit 410, in these examples, provides for communications with other data processing systems or devices. In these examples, communications unit 410 includes one or more network interface cards. Communications unit 410 may provide communications through the use of either or both physical and wireless communications links.

I/O interface(s) 412 allows for input and output of data with other devices that may be connected to computer 400. For example, I/O interface 412 may provide a connection to external devices 418 such as a keyboard, keypad, a touch screen, and/or some other suitable input device. External devices 418 can also include portable computer-readable storage media such as, for example, thumb drives, portable optical or magnetic disks, and memory cards. Software and data used to practice embodiments of the present invention can be stored on such portable computer-readable storage media and can be loaded onto persistent storage 408 via I/O interface(s) 412. I/O interface(s) 412 also connect to a display 420.

Display 420 provides a mechanism to display data to a user and may be, for example, a computer monitor.

The programs described herein are identified based upon the application for which they are implemented in a specific embodiment of the invention. However, it should be appreciated that any particular program nomenclature herein is used merely for convenience, and thus the invention should not be limited to use solely in any specific application identified and/or implied by such nomenclature.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A method, executed by a computer, for improving circuit performance, the method comprising:
    receiving an electronic representation of a plurality of latching circuits associated with a design file; and
    increasing a transistor gate pitch for selected transistors of the plurality of latching circuits, wherein the selected transistors comprise transistors that propagate an input signal of a latch to an output signal of the latch.

2. The method of claim 1, wherein increasing the transistor gate pitch comprises at least doubling the transistor gate pitch.

3. The method of claim 1, wherein the selected transistors comprise pass transistors.

4. The method of claim 1, wherein the selected transistors comprise inverting transistors.

5. The method of claim 1, wherein a latching circuit of the plurality of latching circuits comprises one or more transistors for test scan functionality.

6. The method of claim 1, wherein the design file corresponds to a design library.

7. The method of claim 1, wherein the design file corresponds to a chip design.

8. The method of claim 1, further comprising updating the electronic representation of the plurality of latching circuits.

9. The method of claim 1, further comprising fabricating a chip comprising the plurality of latching circuits.

10. A computer program product for improving circuit performance, the computer program product comprising:
    one or more non-transitory computer-readable storage media and program instructions stored on the one or more non-transitory computer-readable storage media, the program instructions comprising instructions to:
    receive an electronic representation of a plurality of latching circuits associated with a design file; and
    increase a transistor gate pitch for selected transistors of the plurality of latching circuits, wherein the selected transistors comprise transistors that propagate an input signal of a latch to an output signal of the latch.

11. The computer program product of claim 10, wherein the program instructions further comprise instructions to fabricate a chip comprising the plurality of latching circuits.

12. The computer program product of claim 10, wherein the program instructions further comprise instructions to update the electronic representation of the plurality of latching circuits.

13. The computer program product of claim 10, wherein the program instructions to increase the transistor gate pitch comprises instructions to at least double the transistor gate pitch.

14. The computer program product of claim 10, wherein a latching circuit of the plurality of latching circuits comprises one or more transistors for test scan functionality.

15. The computer program product of claim 10, wherein the design file corresponds to a chip design.

16. The computer program product of claim 10, wherein the design file corresponds to a design library.

* * * * *